United States Patent

[11] 3,617,822

[72] Inventor Isamu Kobayashi
Yokohama-shi, Japan
[21] Appl. No. 872,335
[22] Filed Oct. 29, 1969
[45] Patented Nov. 2, 1971
[73] Assignee Sony Corporation
Tokyo, Japan
[32] Priorities Dec. 5, 1967
[33] Japan
[31] 42/78032;
Oct. 30, 1968, Japan, No. 43/79129; Oct. 30, 1968, Japan, No. 43/79130
Continuation-in-part of application Ser. No. 780,702, Dec. 3, 1968.

[54] SEMICONDUCTOR INTEGRATED CIRCUIT

7 Claims, 38 Drawing Figs.

[52] U.S. Cl. .................... 317/235 R, 148/175, 317/235 (22.11), 317/235 (48.7), 317/235 (40.1), 317/235 (22.1)
[51] Int. Cl. .................... H01l 19/00
[50] Field of Search .................... 317/235 (22.11), 235 (48.7); 148/174, 175

[56] References Cited

UNITED STATES PATENTS

| | | | |
|---|---|---|---|
| 3,327,182 | 6/1967 | Kisinko | 317/235 |
| 3,335,038 | 8/1967 | Doo | 317/235 |
| 3,372,063 | 3/1968 | Suzuki | 317/235 |
| 3,454,835 | 7/1969 | Rosvold | 317/235 |
| 3,475,661 | 10/1969 | Iwata et al. | 317/235 |

*Primary Examiner*—Jerry D. Craig
*Attorney*—Hill, Sherman, Meroni, Gross & Simpson

ABSTRACT: A semiconductor integrated circuit comprising single crystal regions isolated from each other by means of high-resistance polycrystalline regions and PN junctions. The polycrystalline regions and the single crystal regions and doped with the same impurity concentration but the resistivity of the polycrystalline regions is much greater than that of the single crystal regions.

INVENTOR.
ISAMU KOBAYASHI

BY Hill, Sherman, Meroni, Gross & Simpson ATTORNEYS

INVENTOR.
ISAMU KOBAYASHI

BY Hill, Sherman, Meroni, Gross & Simpson ATTORNEYS

INVENTOR.
ISAMU KOBAYASHI

BY Hill, Sherman, Meroni, Gross & Simpson ATTORNEYS

INVENTOR
ISAMU KOBAYASHI

BY Hill, Sherman, Meroni, Gross & Simpson ATTORNEYS

INVENTOR.
ISAMU KOBAYASHI

BY Hill, Sherman, Meroni, Gross & Simpson ATTORNEYS

INVENTOR
ISAMU KOBAYASHI

BY Hill, Sherman, Meroni, Gross & Simpson ATTORNEYS

INVENTOR
ISAMU KOBAYASHI

BY Hill, Sherman, Meroni, Gross & Simpson ATTORNEYS

INVENTOR.
ISAMU KOBAYASHI

BY Hill, Sherman, Meroni, Gross & Simpson ATTORNEYS

SEMICONDUCTOR INTEGRATED CIRCUIT

CROSS-REFERENCE TO RELATED APPLICATION

This is a continuation-in-part of the U.S. application Ser. No. 780,702, filed Dec. 3, 1968, entitled "Semiconductor Integrated Circuit and Methods of Manufacturing the Same," assigned to the same assignee as this application, discloses part of the same subject matter as that of this application.

BACKGROUND OF THE INVENTION

1. Field of the Invention

This invention relates to a novel semiconductor integrated circuit utilizing both high-resistance polycrystalline regions and PN junctions to isolate components of the integrated circuit from each other.

2. Description of the Prior Art

In semiconductor integrated circuits components must be isolated from adjacent ones as is well known in the art. This isolation has taken place in the art by means of a PN junction isolation, dielectric isolation, air isolation, beam lead or like method. With the PN junction isolation method, isolation regions are formed by diffusion techniques, which takes an appreciable amount of time for the diffusion and further the diffused isolation regions between adjacent components impose a limitation upon the density of the components. This introduces a difficulty in the high-speed response due to parasitic capacity caused by interconnections, electrodes and the junctions for isolation.

SUMMARY OF THE INVENTION

The present invention has for its object the provision of a semiconductor integrated circuit employing polycrystalline regions for the isolation of circuit components. Namely single crystal and polycrystalline regions are formed by vapor growth techniques on a single crystal substrate, in which case the impurity concentration is selected to be below a particular value to enhance the resistivity of the polycrystalline regions remarkably greater than that of the single crystal regions, and the circuit components are isolated from adjacent ones by such high-resistance polycrystalline regions.

DESCRIPTION OF THE PREFERRED EMBODIMENTS

The present invention is based upon a discovery of a novel characteristic of single crystal and polycrystalline semiconductors which will hereinbelow be described in detail.

Figure 1:
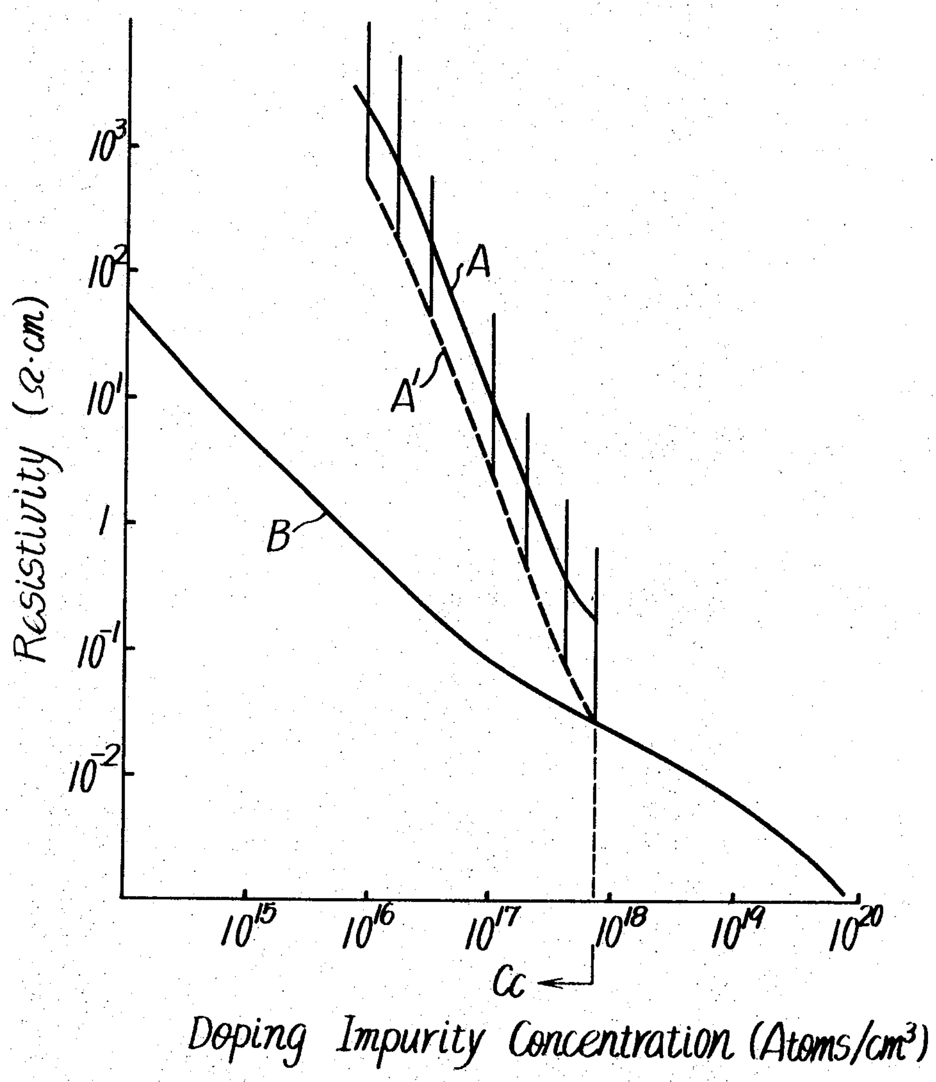
FIG. 1 is a graph showing the resistivity of polycrystalline and single crystal semiconductors relative to impurity concentrations, for explaining the present invention.

Hitherto, various characteristics of the single crystal and polycrystalline semiconductors have been made clear but the inventor of this invention has discovered that when the single crystal and polycrystalline semiconductors are doped with an impurity, their impurity concentration to resistivity characteristics greatly differ from each other, as will be seen from FIG. 1.

In the figure the abscissa represents the doping impurity concentration in atoms per cc. and the ordinate the resistivity in ohm cm. The curves A and B respectively show the impurity concentration-resistivity characteristics of the polycrystalline and single crystal semiconductors doped with arsenic. Vertical lines crossing the curve A show a range of dispersion in experimental values and the curve A' the lower limit of the dispersion. The impurity concentration at which the resistivities of the polycrystalline and single crystal semiconductors are equal to each other is referred to as a critical concentration Cc. In view of dispersion of the resistivity of the polycrystalline semiconductor, the impurity concentration at the intersecting point of the curves A' and B is indicated as the critical concentration in this case. The characteristic curves depicted in the figure were obtained by the following method. Namely, silicon single crystal semiconductor substrates containing arsenic of different concentrations as an impurity were prepared and subjected to mirror lapping by a known method; thereafter being rinsed. Then, a silicon polycrystalline layer including an amorphous layer was formed to a thickness of about 1 micron on one surface of each substrate at a temperature of 550° C. by the vapor growth method. The polycrystalline layer would serve as a seeding site for polycrystalline development in the subsequent formation of single crystal and polycrystalline regions by the vapor growth method. For the formation of the polycrystalline layer silicon tetrachloride was packed into a bubbler of a known vapor growth device together with arsenic trichloride in an amount necessary for rendering the impurity concentration of the polycrystalline layer to be equal to that of the single crystal semiconductor substrate Next, the polycrystalline layer formed on one surface of the semiconductor substrate was removed at one selected area to expose one portion of the surface of the single crystal semiconductor substrate. Thereafter, silicon tetrachloride containing the aforementioned necessary amount of arsenic trichloride was passed over the semiconductor substrate with a carrier gas, for example, a hydrogen gas to form a silicon vapor growth layer about 20 microns on the exposed substrate and the aforementioned polycrystalline layer serving as the seeding site at a temperature of 1,150° C. In this case, the silicon vapor growth layer consisted of a silicon single crystal semiconductor region, that is, a single crystal layer formed on the exposed single crystal semiconductor substrate and a polycrystalline region, that is, a polycrystalline layer formed on the polycrystalline seeding site. The impurity concentration-resistivity characteristics of the single crystal and polycrystalline vapor growth regions thus formed were as shown in FIG. 1 The seeding site for polycrystalline development is not limited specifically to the aforementioned one but may be formed by vapor deposition of silicon containing substantially no impurity or a silicon oxide layer of a thickness of about 500 angstroms. In this case, the oxide film of a thickness of about 500 angstroms has flaws such as pin holes, so that silicon is formed as a polycrystalline region on the oxide film by the vapor growth method. With the vapor growth method, the same results were obtained even by using monosilane or using phosphorus oxychloride or phosphorus pentachloride as an impurity or even with the temperature for the vapor growth lying in a temperature range of 1,050° to 1,250° C. for usual vapor growth.

Even in the event that the impurity concentration of the polycrystalline semiconductor region is equal to that of the single crystal semiconductor region, if the impurity concentration of the polycrystalline region is lower than the critical concentration Cc of FIG. 1, the resistivity of the polycrystalline region is considered to exceed that of the single crystal region for the following reasons, which, however, have not been as yet ascertained.

i. The impurity is educed on the surfaces of fine single crystals (for their grain boundaries) forming the polycrystals.

ii. Carriers are trapped on the grain boundaries to decrease the carrier concentration contributing to conduction.

iii. In the polycrystals the mean free path of the carriers is short and its mobility is low.

Utilizing the above-described characteristics, the present invention provides a semiconductor integrated circuit in which single crystal semiconductor regions are isolated from adjacent ones by polycrystalline semiconductor regions of a concentration lower than the critical concentration Cc and consequently of high resistance and a method of making such a semiconductor integrated circuit.

The present invention will hereinafter be described in detail by way of example.

Figure 2A:
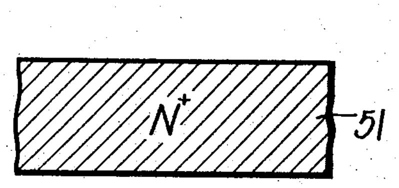
FIGS. 2A to 2E show in side elevation on a greatly enlarged scale a sequence of steps involved in the manufacture of a semiconductor integrated circuit according to this invention.
Figure 2B:
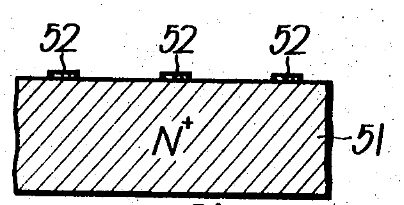
Figure 2C:
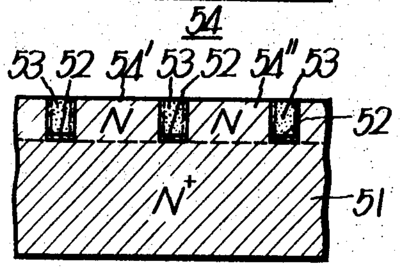
Figure 2D:
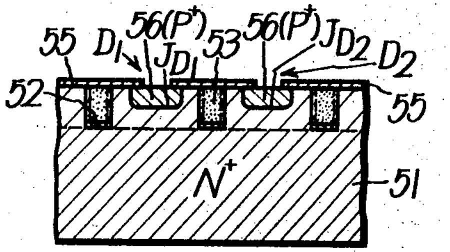
Figure 2E:
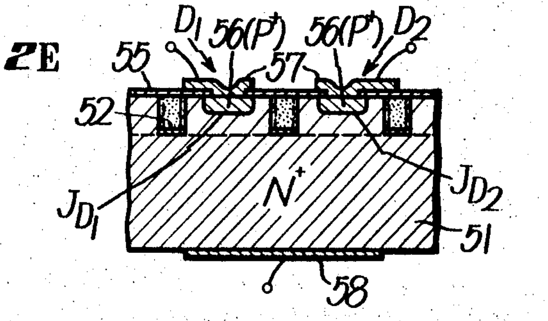
Figure 2F:
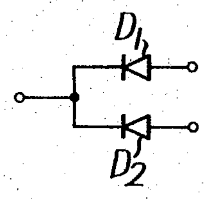
FIG. 2F is an equivalent circuit diagram of the integrated circuit exemplified in FIGS. 2A to 2E.

FIGS. 2A to 2E illustrate one embodiment of this invention and FIG. 2F is a circuit diagram of a semiconductor device produced by the method depicted in FIGS. 2A to 2E, in which reference characters $D_1$ and $D_2$ indicate diodes.

The manufacture of the above semiconductor device begins with the preparation of a silicon single crystal semiconductor substrate (a single crystal semiconductor slice) 51 such as shown in FIG. 2A which is highly doped with an N-type impurity, for example, phosphorus. Then, one surface of the semiconductor substrate 51 is deposited at selected areas with seeding sites 52 for polycrystalline development as of silicon dioxide or trisilicon tetranitride which has a masking effect against subsequent impurity diffusion. In this case, it is preferred to form a silicon layer on the silicon dioxide layer by means of vapor deposition or the like, if necessary. The seeding sites 52 are provided in the form of a fretwork to circumscribe therein single crystal semiconductor regions which will be subsequently formed, as shown in FIG. 2B. Following this, silicon, which is doped with an impurity of a concentration lower than the critical concentration Cc, is formed to a thickness of about 8 microns on the single crystal semiconductor substrate 51 including the seeding sites 52 by the vapor growth method in the same manner as that previously described with FIG. 1. This leads to the formation of polycrystalline semiconductor regions (polycrystalline layers) 53 on the seeding sites 52 and a layer 54 consisting of single crystal semiconductor layers 54′ and 54″ on the single crystal semiconductor substrate 51, as depicted in FIG. 2C. Then, a silicon oxide or dioxide film 55 is formed by thermal oxidation on the vapor growth layer consisting of the polycrystalline and single crystal layers 53 and 54 and the film 55 is removed at selected locations to form therein windows, through which boron, a P-type impurity, is diffused into the vapor growth layer to a depth of 3 to 5 microns, providing anode regions 56 having diode junctions $J_{D1}$ and $J_{D2}$ of the diodes $D_1$ and $D_2$, as shown in FIG. 2D. Thereafter, aluminum or like metal is deposited on the anode regions 56 of the diodes in a manner to make an ohmic contact therewith to provide electrodes 57 and gold is deposited to the underside of the single crystal semiconductor substrate 51 to form a cathode electrode 58, thus providing a finished semiconductor device such as illustrated in FIG. 2E.

With the foregoing method, the resistivity of the polycrystalline layers 53 is greater than that of the single crystal layer 54 because the impurity concentration of the former is lower than the critical concentration Cc, so that a high resistance is present between the island regions formed by the single crystal layers 54′ and 54″ to prevent the formation of a parasitic element. In the foregoing the impurity concentration of the vapor growth layer is lower than the critical concentration Cc but is preferred to define the lower limit value of the impurity concentration of the vapor growth layer.

Namely, in the foregoing example the impurity concentration of the vapor growth layer, that is, the polycrystalline and single crystal layers 53 and 54 is selected to be higher than $10^{12}$ atoms/cm.$^3$ in the process of FIG. 2C. In the event of vapor growth of an impurity of a lower concentration than $10^{12}$ atoms/cm.$^3$, the resistivity of the vapor growth layer, especially the single crystal layer 54 is not held constant, even if silicon tetrachloride, monosilane or other silane is used or even if an impurity such, for example, as phosphorus oxychloride is used for doping phosphorus or even if arsenic trichloride is used for doping arsenic or even if antimony is used as an impurity. The reasons for the unstability of the resistivity have not been clarified but are considered as follows:

i. Slight variations in the temperature of the furnace during the vapor growth process.

ii. Out diffusion of the impurity from the single crystal semiconductor substrate.

iii. Autodoping of the impurity from the single crystal semiconductor substrate into the vapor growth layer.

iv. Changes in the characteristics of the crystals due to an oxygen slightly contained in the carrier gas (though zero theoretically).

It has been ascertained that with the impurity concentration being below $10^{12}$ atoms/cm.$^3$, the regulation of the resistivity becomes rapidly great.

The use of a single crystal layer of a great regulation of its resistivity causes variations in the junctions, breakdown voltages and depth of the junctions of the anode regions 56 of the diodes formed by the diffusion of an impurity as in the process of, for example, FIG. 2D, thus introducing nonuniformity in the characteristics of the finished semiconductor devices. In the event that the impurity concentration of the single crystal layer 54 is lower than $10^{12}$ atoms/cm.$^3$, the depth of the junctions varies for the reason that in the vapor growth process the impurity present in the silicon single crystal semiconductor substrate 51 diffuses up to the upper surface portion of the single crystal layer 54 (where the junctions $J_{D1}$ and $J_{D2}$ are formed) to change the impurity concentration in those portions. Even if the thickness of the vapor growth layer 54 increases, the time for the vapor growth becomes longer, so that the impurity of the single crystal semiconductor substrate 51 is diffused further and the aforementioned defects cannot be avoided.

Referring now to FIG. 3, a detailed description will be given of another embodiment of this invention.

Figures 3A, 3B, 3C, 3D, 3E, 3F:
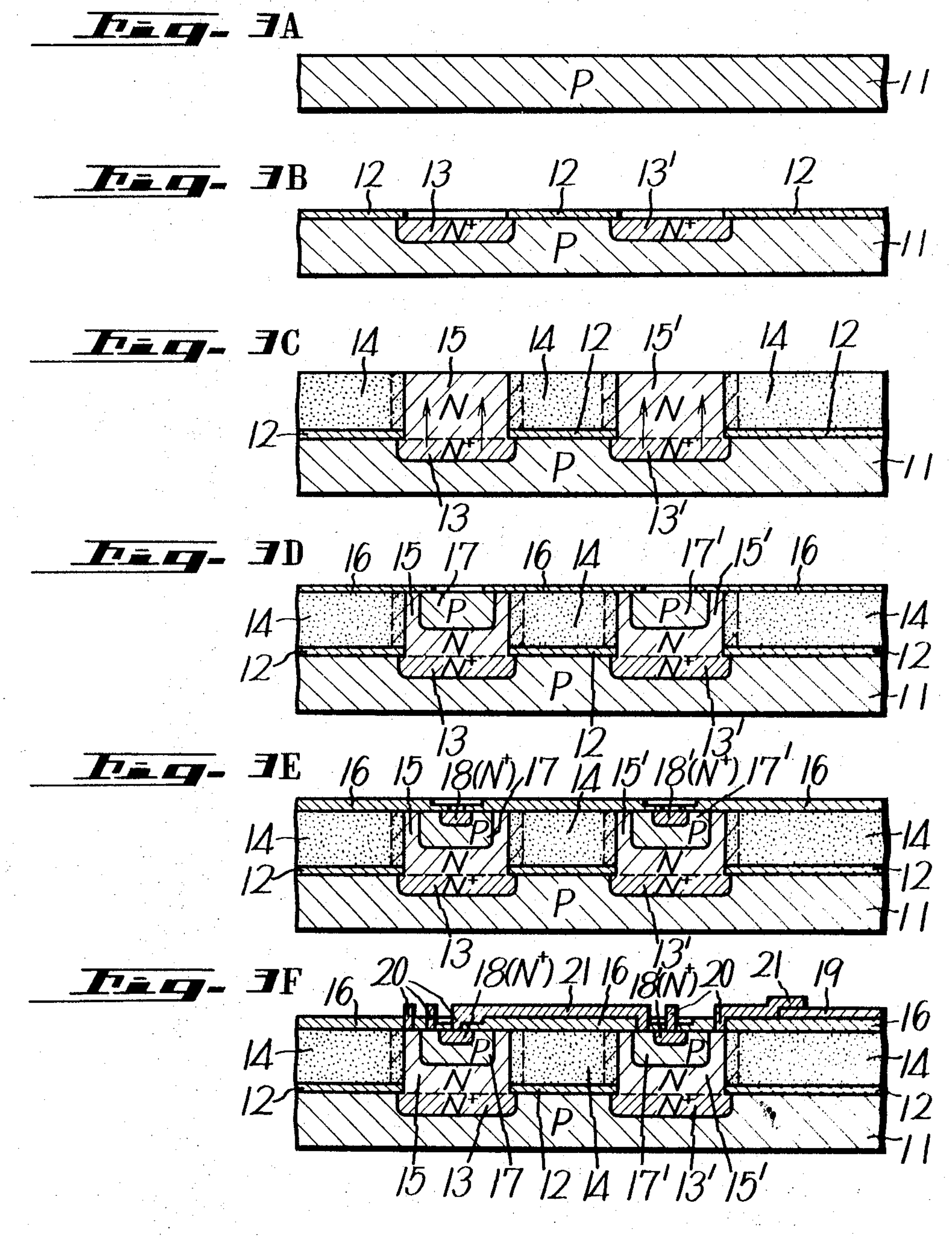
FIGS. 3A to 3F illustrate steps in a modified form of this invention.

The manufacture begins with the preparation of, for example, a P-type single crystal semiconductor substrate 11 such as shown in FIG. 3A. An oxide film 12 as of silicon dioxide which will serve as a diffusion mask and as a seeding site for polycrystalline development is deposited over the entire area of the upper surface of the single crystal semiconductor substrate 11 and the oxide film 12 is selectively removed by means of photoetching or the like in a manner to leave the film 12 in the form of, for example, a fretwork. Then, an N-type impurity is diffused into the single crystal semiconductor substrate 11 with the oxide film 12 being used as the mask, thus providing a plurality of high impurity, that is, $N^+$-type buried layers 13 and 13′ as depicted in FIG. 3B. Next, an oxide film which has been formed on the $N^+$-type semiconductor regions 13 and 13′ in the diffusion of the N-type impurity is removed at selected locations, after which is formed by vapor growth on the substrate 11 semiconductor regions 15 and 15′ which are of an impurity concentration lower than the critical concentration, for example, less than $1\times10^{17}$ atoms/cm.$^3$ and preferably higher than $1\times10^{12}$ atoms/cm.$^3$ and is of the conductivity type opposite to that of the substrate 11, for example N-type, as previously described with FIG. 1.

The resulting vapor growth layer consists of polycrystalline layers 14 grown on the seeding sites 12 and the single crystal layers 15 and 15′ grown on the $N^+$-type semiconductor regions 13 and 13′. As will be seen from the following description, the single crystal layers 15 and 15′ become isolated island regions and serve as collector regions of transistors which will be formed, for example, in these island regions. In this case, it is preferred that the thickness of the oxide film 12 is approximately 2,000 angstroms, that the temperature for the vapor growth is 1,050° to 1,250° C. and that the thicknesses of the crystal layers are about 5 microns. Although the N-type impurity diffuses from the $N^+$-type semiconductor regions 13 and 13′ into the polycrystalline layer 14 as indicated by the arrows in FIG. 3C, the resistance of the polycrystalline layer 14 can be greatly increased effectively by increasing the lateral width of the polycrystalline layer 14 (the distance between the two single crystal semiconductor regions 15 and 15′) as much as possible.

Figure 4:
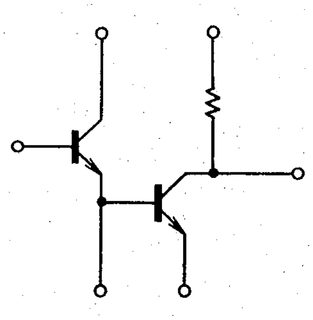
FIG. 4 is an electric circuit diagram of the semiconductor integrated circuit depicted in FIG. 3.

This is followed by the formation of semiconductor elements in the N-type single crystal layers 15 and 15′. As shown in FIG. 3D, a P-type impurity such, for example, as boron is diffused into the single crystal layers 15 and 15' through a diffusion mask formed by an oxide film 16 to provide P-type semiconductor regions 17 and 17' which will ultimately serve as base regions of the transistors. Thereafter, an N-type impurity is diffused into the P-type semiconductor regions 17 and 17' through the oxide film 16 serving as a mask to provide high-impurity concentration, that is, $N^+$-type semiconductor regions 18 and 18' which will ultimately function as emitter regions of the transistors as depicted in FIG. 3E. Thus, the semiconductor elements (transistors) are formed in the single crystal layers 15 and 15'. Further, a thin film element, for example, a thin film resistor 19 is formed on the polycrystalline layer 14 at one location through the oxide film 16 by means of metal vapor deposition or the like as illustrated in FIG. 3F. Then, for example, aluminum is vapor-deposited through a predetermined mask to provide predetermined electrodes 20 for the semiconductor elements formed in the single crystal layers 15 and 15' and leads 21 interconnecting predetermined electrodes and a selected electrode with the thin film element 19. In FIG. 4 there is illustrated electric connections of the semiconductor integrated circuit thus formed.

The foregoing construction provides for enhanced insulation between the semiconductor elements formed in the single crystal layers 15 and 15' and the semiconductor elements and the thin film element 19 to provide complete isolation of the elements formed on the same substrate. This ensures to avoid interference between the elements, so that they can be regarded as formed on separate substrates to provide for enhanced characteristics of the integrated circuit.

Figure 5:
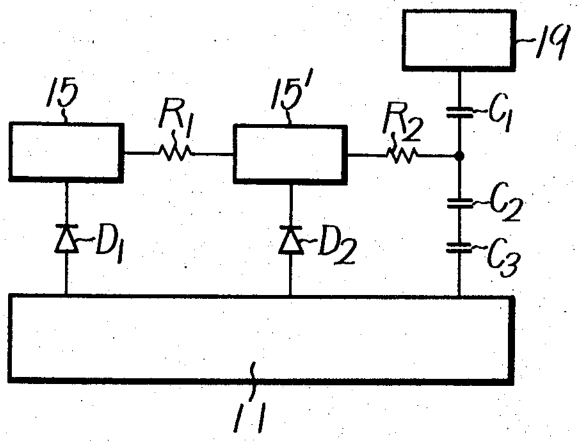
FIG. 5 is its equivalent circuit diagram relative to insulation.
Figure 6A:
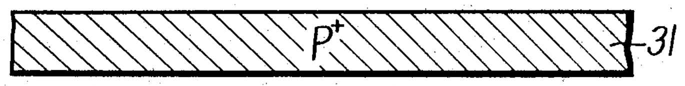
FIGS. 6A to 6F and FIGS. 7A to 7I show steps in other modifications of this invention.
Figure 6B:
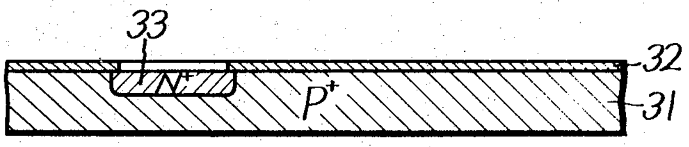
Figure 6C:
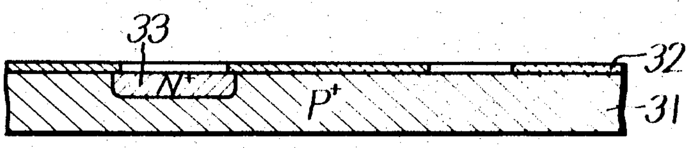
Figure 6D:
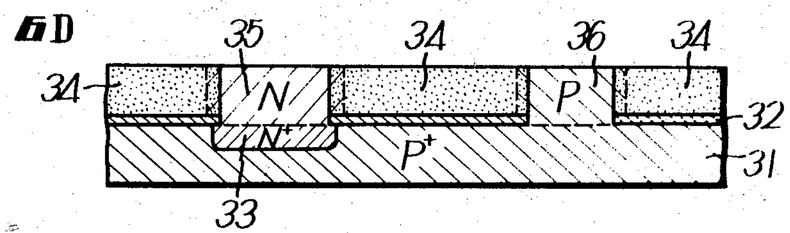
Figures 6E, 6F:
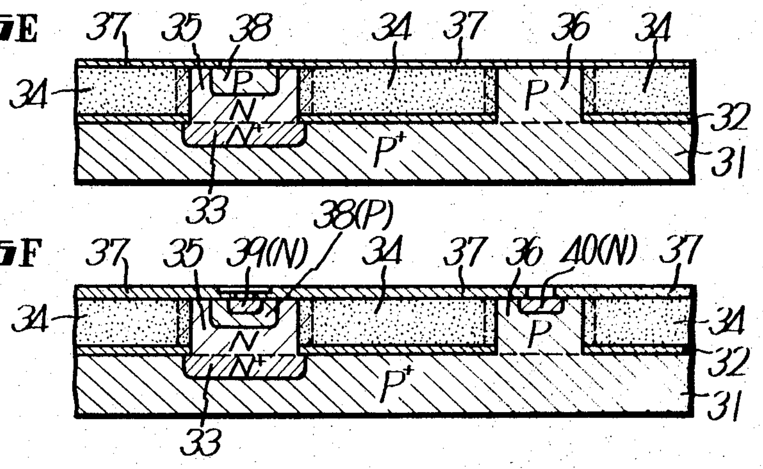
Figure 7A:
Figure 7B:
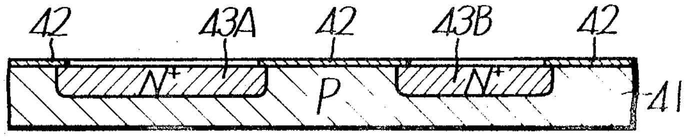
Figure 7C:
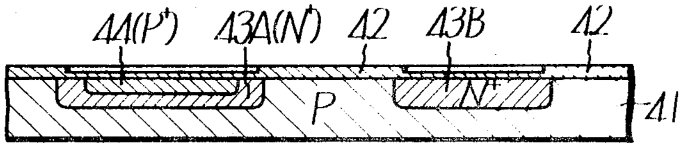
Figure 7D:
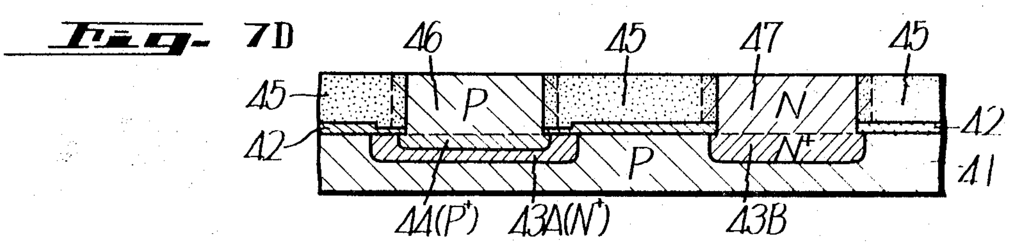
Figure 7D:
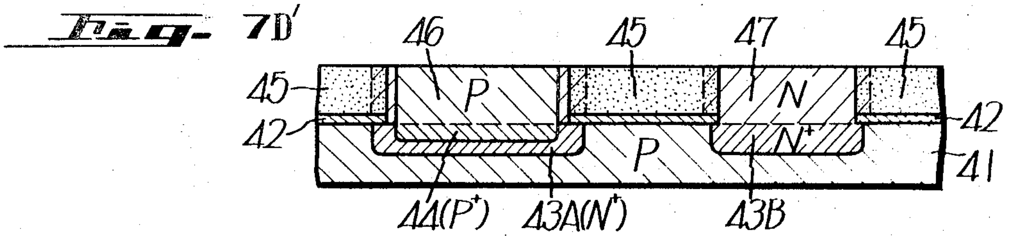
Figure 7E:
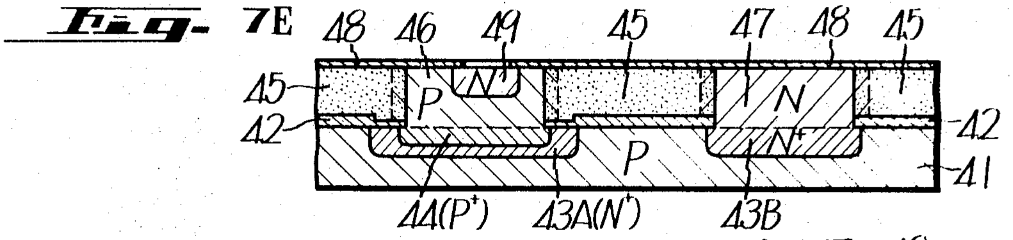
Figure 7F:
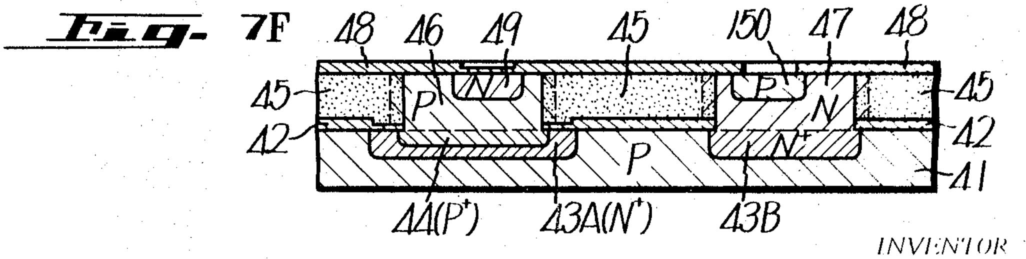
Figure 7G:
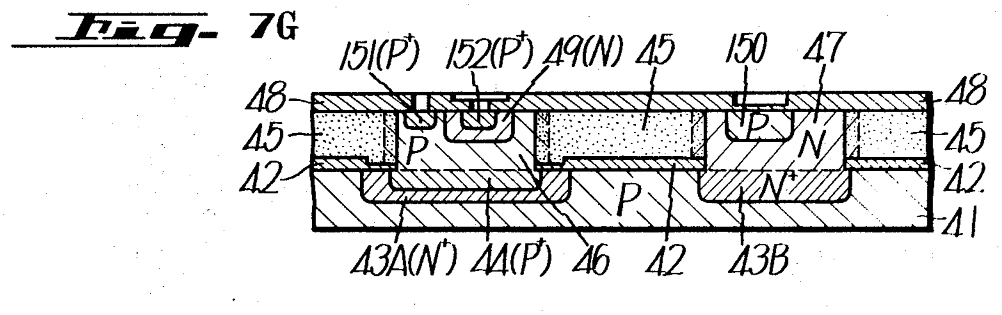
Figure 7H:
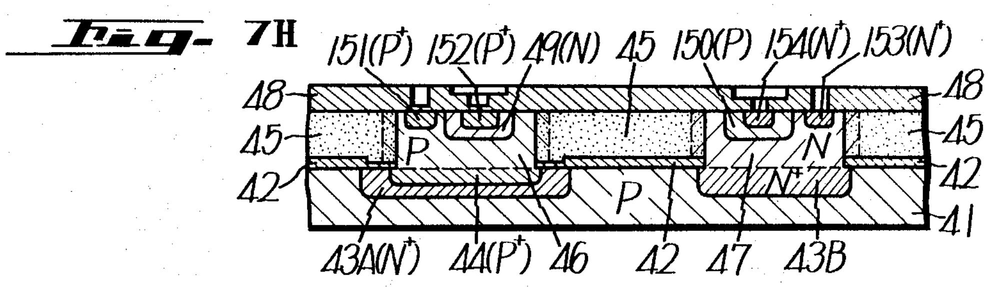
Figure 7I:
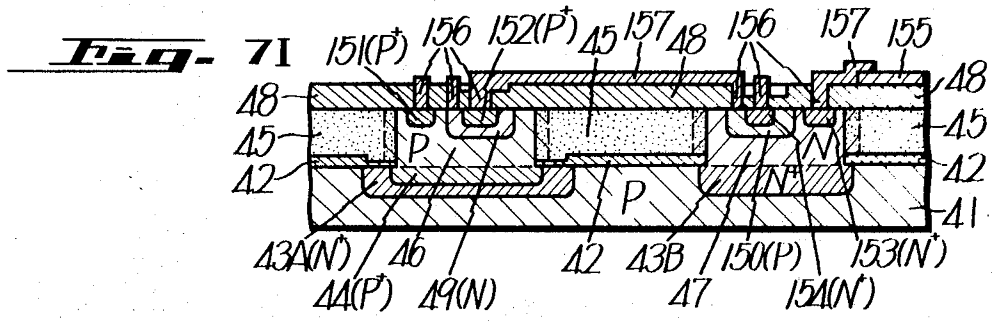

In FIG. 5 there is illustrated an equivalent circuit of the semiconductor integrated circuit of such a construction in terms of the insulation. In the figure reference numerals 15 and 15' respectively correspond to the N-type single crystal layers 15 and 15', 11 and 19 the P-type crystal semiconductor substrate and the thin film element in FIG. 3.

Reference character $D_1$ indicates a diode having a PN junction formed between the P-type semiconductor substrate 11 and the $N^+$-type semiconductor region 13 underlying the N-type single crystal layer 15 and $D_2$ a diode having a PN junction formed between the P-type semiconductor substrate 11 and the $N^+$-type semiconductor region 13' underlying the N-type single crystal layer 15'. Reference character $R_1$ designates a lateral resistance of the polycrystalline layer 14 lying between the two single crystal layers 15 and 15' and $R_2$ a lateral resistance of the polycrystalline layer 14 underlying the thin film element 19. Reference character $C_1$ identifies a capacitor formed by the oxide film 16 interposed between the polycrystalline layer 14 and the thin film element 19 and $C_2$ a capacitor formed by the polycrystalline layer 14. In this case the polycrystalline layer 14 has a high resistance and can be regarded as a dielectric as will be described later, so that its resistance in a longitudinal direction is omitted and only its capacity is shown. Reference character $C_3$ indicates a capacitor formed by the oxide film 12 interposed between the polycrystalline layer 14 and the semiconductor substrate 11.

As will be apparent from FIG. 5, the single crystal layer 15 is completely insulated from the substrate 11 by the PN junction diode $D_1$ and, at the same time, from the single crystal layer 15' by the polycrystalline layer 14. Namely, according to the present invention the impurity concentration of the semiconductor material for the vapor growth of the single crystal layers 15 and 15' and the polycrystalline layer 14 is selected to be lower than approximately $1\times10^{17}$ atoms/cm.$^3$ as previously described and it has been ascertained that the polycrystalline layer 14 exhibits resistivity high enough to essentially insulate the circuit components of usual semiconductor integrated circuits.

As will be seen from the curve showing the relationship between the impurity concentration and resistivity of the polycrystalline layer in FIG. 1, when the impurity concentration is about $1\times10^{17}$ atoms/cm.$^3$ the resistivity of the polycrystalline semiconductor is about one hundred times as high as that of the single crystal semiconductor. Incidentally, a single crystal semiconductor of an impurity concentration of about $1\times10^{17}$ atoms/cm.$^3$ exhibits the conductivity type of the impurity and its resistivity is approximately 0.1 ohm cm., while the resistivity of a polycrystalline semiconductor of such an impurity concentration is as high as more than 10 ohm cm. Especially, with the impurity concentration being less than $10^{16}$ atoms/cm.$^3$, the insulation of the polycrystalline layer was so high that its resistivity could not be measured by the four probe method.

Further, the reason why the impurity concentration of the semiconductor material for the vapor growth of the single crystal layers 15 and 15' and the polycrystalline layer 14 is selected to be higher than $1\times10^{12}$ atoms/cm.$^3$ is that with a lower impurity concentration the semiconductor elements, that is, the polycrystalline regions forming the junctions do not always exhibit a desired conductivity type and hence are unstable and that the rectifying characteristics of the junctions are likely to lower. For example, in the event that the $N^+$-type semiconductor regions 13 and 13' as previously described with FIG. 3, the impurity concentrations in the surface portions of the regions 13 and 13' are unstable and the impurity concentrations in the upper portion of the single crystal layers 15 and 15' are also unstable, so that their resistivity is very difficult to hold at a predetermined value under the influence of subsequent heat treatment for diffusion and so on. Where a P-type impurity is diffused into such island regions 15 and 15' to provide therein base regions, the depth of the diffusion cannot be controlled at a predetermined value, and consequently the characteristics of the finished transistors are unstable.

In the semiconductor integrated circuit produced according to this invention, the single crystal layer 15 is completely insulated from the substrate 11 by the PN junction diode $D_2$ and is completely insulated from the thin film element 19 by the polycrystalline layer 14 and the capacitor $C_1$, as has been described in the foregoing. Accordingly, the semiconductor elements formed in the single crystal layers 15 and 15' are completely isolated from each other as if they are formed on separate substrates, so that interference between the semiconductor elements can be avoided.

Further, the thin film element 19 is completely insulated from the substrate 11 and the single crystal layer 15' by the capacitors $C_1$, $C_2$ and $C_3$ and the resistor $R_2$. Consequently, the semiconductor elements formed in the single crystal layers 15 and 15' and the thin film element 19 formed on the oxide film 16 are isolated from each other in excellently insulated conditions to eliminate interference therebetween. Thus, the present invention does not cause any deterioration of the characteristics of the elements and hence this invention is of particular utility when employed in integrated circuits or the like in which a plurality of elements are formed on the same substrate.

In addition, since the capacitors $C_1$, $C_2$ and $C_3$ are inserted in series connection between the thin film element 19 and the substrate 11, their capacities are small and accordingly the parasitic capacity effect is minimized. Further, the surface of the polycrystalline layer 14 is uneven about 0.5 to 2 microns, so that the oxide film 16 overlying the layer 14 becomes uneven. Therefore, the surface area of the oxide film 16 increases to enhance the efficiency of the thin film element, for example, a thin film resistor or capacitor per unit area and the unevenness facilitates the adhesion of the thin film element to the oxide film 16. In the event that the passive element is formed of a thin film, it is possible to form on the semiconductor substrate the passive element which has a value covering a wide range and is small in the temperature coefficient and of high precision in value, as compared with a thin film element formed by diffusion.

In FIG. 6 there is a series of greatly enlarged cross-sectional views of the successive steps involved in the manufacture of a semiconductor integrated circuit in accordance with another modified form of this invention. The manufacture begins with the preparation of a single crystal semiconductor substrate 31 of a predetermined conductivity type, for example, $P^+$-type one such as shown in FIG. 6A. The upper surface of the single crystal semiconductor substrate 31 is deposited with an oxide film 32 as of silicon dioxide, which film is removed at selected locations by means of etching or the like to form a window. Then, an N-type impurity is diffused through the window into the semiconductor substrate 31 to form therein an $N^+$-type semiconductor region 33 as depicted in FIG. 6B. Thereafter, the oxide film overlying the $N^+$-type semiconductor region 33 and the substrate 31 is selectively etched away to provide seeding sites 32 for polycrystalline development, as shown in FIG. 6C. In this case, it is preferred to form the seeding sites by vapor deposition of silicon on the remaining oxide film 32 at a temperature as low as approximately 550° C. so as to facilitate the formation of polycrystalline layers. The same is true of the example shown in FIG. 3. The next step consists in the vapor deposition of a semiconductor material of an impurity concentration which is higher than the aforementioned lower limit value of $10^{12}$ atoms/cm.$^3$ but is below the critical concentration Cc, that is, $10^{17}$ atoms/cm.$^3$. The resulting vapor growth layer consists of polycrystalline layers 34 grown on the oxide film 32 and single crystal layers 35 and 36 on the $N^+$-type semiconductor region 33 and the substrate 31, as depicted in FIG. 6D. During the vapor growth process the N-type impurity present in the $N^+$-type semiconductor region 33 diffuses into the overlying single crystal layer 35 but it has been found that the impurity concentration of the surface portion does not greatly change in the subsequent formation of, for example, a base region by selecting the impurity concentration of the semiconductor material to exceed the aforementioned lower limit value. Further, during the vapor growth process the P-type impurity of the $P^+$-type substrate 31 diffuses into the overlying single crystal layer 36 to render it P-type but the impurity concentration of the substrate 31 can be controlled with appreciable precision, so that no special problem occurs. The formation of the vapor growth layer is followed by the formation of a semiconductor element in the N-type single crystal layer 35. That is, a P-type impurity is diffused into the single crystal layer 35 through a window formed in an oxide film 37 to provide a P-type semiconductor region 38 in the layer 35 as illustrated in FIG. 6E. Next, an N-type impurity is diffused into the P-type semiconductor region 38 through the oxide film 37 serving as a diffusion mask to form an N-type semiconductor region 39 in the region 38 as depicted in FIG. 6F. In this case, the N-type impurity is simultaneously diffused into the P-type single crystal layer 36 to form therein an N-type semiconductor region 40, thus providing a diffused resistor in the P-type single crystal layer 36. Thus, the semiconductor element and the diffused resistor are formed in the single crystal layers 35 and 36 respectively. Then, a thin film element, interconnecting leads, electrodes and so on are formed as in the semiconductor integrated circuit of FIG. 3.

In the semiconductor integrated circuit of such a construction, the semiconductor elements formed in the single crystal layers 35 and 36 are well insulated from each other and the elements formed on the same substrate can be isolated from one another, as will be apparent from the foregoing. Accordingly, the present example provides the same results as those obtainable with the foregoing examples.

Figure 8:
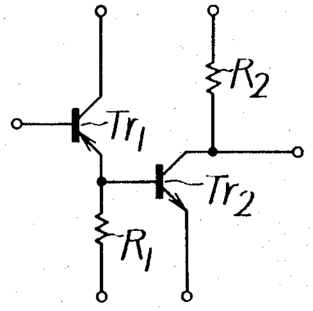
FIG. 8 is an electric connection diagram of the semiconductor integrated circuit shown in FIG. 7.

FIG. 7 illustrates steps of a further modified form of this invention. The first step is to prepare a single crystal semiconductor substrate 41 of a predetermined conductivity type, for example, a P-type one, such as illustrated in FIG. 7A. The single crystal semiconductor substrate 41 is deposited over its upper surface with an oxide film 42 as of silicon dioxide, which is then removed at selected areas by etching or the like to form therein windows. Next, for example, an N-type impurity is diffused through the windows of the oxide film 42 into the substrate 41 to form therein $N^+$-type semiconductor regions 43A and 43B as shown in FIG. 7B. The $N^+$-type semiconductor region 43A will ultimately serve as an isolated region of a PNP-type transistor, as will be understood from the following description. Thereafter, a P-type impurity is diffused into the $N^+$-type region 43A through the oxide film 42 serving as a mask, forming a $P^+$-type semiconductor region 44. Following this, the oxide film overlying the $P^+$-type semiconductor region 44 and the $N^+$-type semiconductor region 43B is removed at selected locations, after which is formed a vapor growth layer of, for example, an N-type semiconductor material of an impurity concentration of $1\times10^{12}$ to $1\times10^{17}$ atoms/cm.$^3$ as in the foregoing examples, as shown in FIG. 7D. The resulting vapor growth layer consists of polycrystalline layers 45 grown on the oxide film 42 and single crystal layers 46 and 47 on the $P^+$-type semiconductor region 44 and the $N^+$-type semiconductor region 43B. During the vapor growth process the P-type impurity in the $P^+$-type semiconductor region 44 diffuses into the overlying single crystal layer 46 to render it P-type. It is also possible in this case, to remove the oxide film 42 in such a manner as to position the marginal edge of the window of the film 42 on the $N^+$-type semiconductor region 43A, as depicted in FIG. 7D'. The formation of the vapor growth layer is followed by the formation of semiconductor elements in the P- and N-type single crystal layers 46 and 47. Namely, an N-type impurity is diffused into the P-type single crystal layer 46 through an oxide film 48 serving as a mask to form an N-type semiconductor region 49 as depicted in FIG. 7E. Further, a P-type impurity is diffused into the N-type single crystal layer 47 through the oxide film 48 to form a P-type semiconductor region 150 as shown in FIG. 7F. Then, a P-type impurity is diffused through the oxide film 48 into the P-type single crystal layer 46 and the N-type semiconductor region 49, thus providing $P^+$-type semiconductor regions 151 and 152 as illustrated in FIG. 7G. In this case, the P-type semiconductor region 150 and the $P^+$-type semiconductor regions 151 and 152 may be formed by diffusion simultaneously. Further, an N-type impurity is diffused into the N-type single crystal layer 47 and the P-type semiconductor region 150 to form $N^+$-type semiconductor regions 153 and 154 as depicted in FIG. 7H. In this manner, PNP- and NPN-type transistors are respectively formed in the single crystal layers 46 and 47. Thereafter, a thin film element, for example, a thin film resistor 155 is formed by means of metal vapor deposition or the like on the polycrystalline layer 45 at one area through the oxide film 48 as shown in FIG. 7I. The next step consists in the vapor deposition of, for example, aluminum through a predetermined mask to form predetermined electrodes 156 on the semiconductor elements formed in the single crystal layers 46 and 47, and a lead 157 interconnecting a predetermined electrode and the thin film element 155. In FIG. 8 there is illustrated an electrical connection diagram of the semiconductor integrated circuit thus produced. In the figure a resistor $R_2$ is formed with the thin film resistor 155 and a resistor $R_1$ is not shown in FIG. 7I.

Turning now to FIG. 9, still another example of this invention will hereinafter be described together with a method for the manufacture thereof. The manufacture begins with the preparation of a silicon single crystal semiconductor substrate 61 such as shown in FIG. 9A which contains a P-type impurity, for example, boron. The substrate 61 is deposited over its one surface with an impurity diffusion mask 62 such as a silicon oxide film or the like having formed therethrough windows at predetermined locations, through which phosphorus is diffused as an N-type impurity into the substrate 61 to form therein buried layers B*u* as depicted in FIG. 9B. The impurity concentrations of the buried layers B*u* in the surface portions thereof are selected to be approximately $10^{19}$ atoms/cm.$^3$ and the layers each form one part of each of the collector regions of, for example, transistors to be subsequently formed, thereby to provide for reduced collector saturated resistances.

Figure 9A:
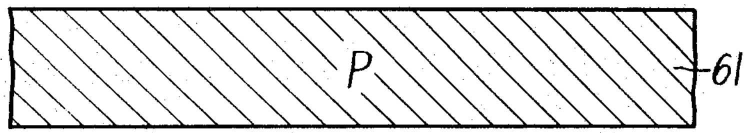
FIGS. 9A to 9F illustrate steps in a further modified form of this invention.
Figure 9B:
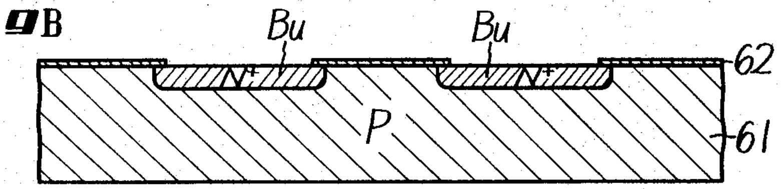
Figure 9C:
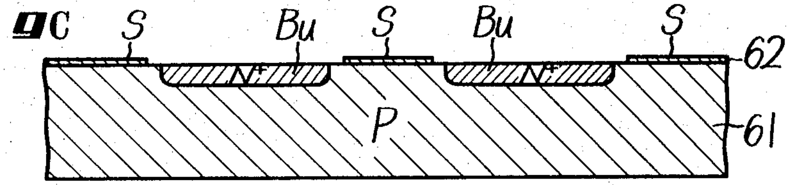

Subsequent to the formation of the buried layers B*u*, for example, silicon is vapor-deposited approximately 1 micron thick to form a seeding site for polycrystalline development in the form of a fretwork surrounding the buried layers B*u* in the same manner as that previously described with FIG. 2, as illustrated in FIG. 9C.

Figure 9D:
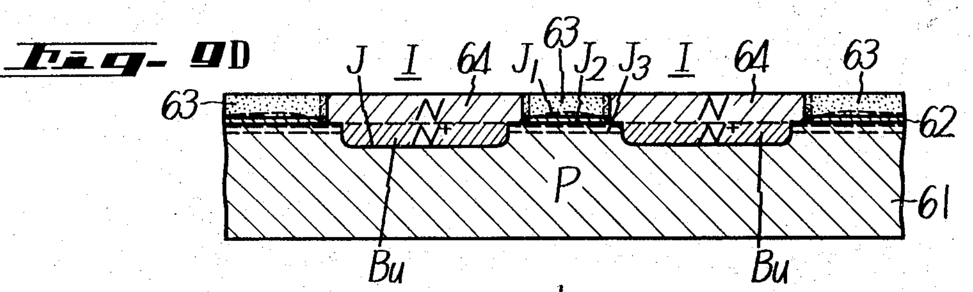

After this, a mixture gas containing silicon tetrachloride and arsenic trichloride is passed over the semiconductor substrate 61 together with hydrogen as a carrier gas at a temperature of 1,150° C., by which a silicon vapor growth layer 63 of an impurity concentration of about $10^{17}$ atoms/cm.$^3$ is formed approximately 10 microns on the semiconductor substrate 61, as depicted in FIG. 9D. The vapor growth layer 63 consists of a polycrystalline semiconductor region 63 grown on the seeding site S and single semiconductor regions on the buried layers B*u* and the exposed single crystal regions of the semiconductor substrate 61. The polycrystalline semiconductor region 63 and the single crystal semiconductor regions 64 are simultaneously formed by the vapor growth method as in the case of FIG. 2, so that the impurity concentrations in their surface portions are equal to each other. However, it has been found that the resistivity of the polycrystalline semiconductor region 63 is at least about 30 times as high as that of the single crystal semiconductor region 64. Thus, island regions I each consisting of the buried layer B*u* and the single crystal semiconductor region 64 are isolated from each other by junctions J formed between the buried layers B*u* and the single semiconductor substrate 61 and by the polycrystalline semiconductor region 63 of higher resistivity than that of the single crystal semiconductor regions 64. The impurity concentration of the polycrystalline semiconductor region 63 formed by the vapor growth method is not limited specifically to the aforementioned value $10^{17}$ atoms/cm.$^3$. With the impurity concentration being below the critical concentration Cc, the resistivity of the polycrystalline semiconductor region can be greatly increased and the island regions can be well isolated from each other.

The single crystal semiconductor substrate 61 and the polycrystalline semiconductor region 63 are different in conductivity type from each other, so that where the impurity concentration of the former exceeds that of the latter, a junction $J_1$ is formed on the boundary plane between the region 63 and the substrate 61 as indicated by the broken line in FIG. 9D and that where the impurity concentration of the single crystal semiconductor substrate 61 is equal to that of the polycrystalline semiconductor region 63, a junction $J_2$ is formed therebetween as similarly indicated by the broken line in the figure. In the event that the impurity concentration of the substrate 61 is lower than that of the region 63, a junction $J_3$ is formed in the substrate 61. In the latter case, in each island region I an N-type region is formed in the surface portion of the single crystal semiconductor substrate (in the lower portion of the polycrystalline semiconductor region 63) and the island regions I are contiguous to each other through the N-type region but since this N-type region is formed by the diffusion of the impurity in the polycrystalline semiconductor region of high resistance, the impurity concentration of the diffused N-type region is appreciably low and the resistance value between the two island regions I is not diminished.

Figure 9E:
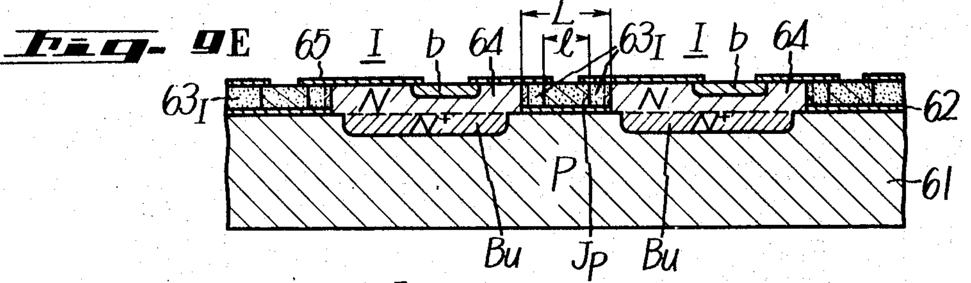
Figure 9F:
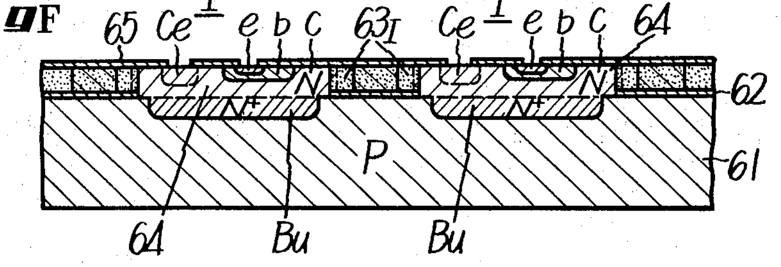

In the event that the impurity concentration of the single crystal semiconductor substrate 61 is less than that of the polycrystalline semiconductor region 63, if the seeding site S is formed by vapor deposition of, for example, silicon on a silicon oxide, trisilicon tetrachloride or like layer which is formed preferably more than 1.000 angstroms by means of, for example, thermal oxidation and is used as an impurity diffusion mask in the process of FIG. 9C, the junction $J_3$ is not formed. A silicon oxide film 65 is formed by thermal oxidation on the single crystal semiconductor regions 64 having formed therein the island regions I and the polycrystalline semiconductor region 63 and the silicon oxide film 65 is selectively removed to form therein windows through which a P-type impurity, for example, boron is diffused into the single crystal semiconductor regions 64 to provide therein base regions *b* as shown in FIG. 9E. In this case, it is possible that the oxide film 65 is removed to form a window on the polycrystalline semiconductor region 63, through which boron is diffused into the polycrystalline region concurrently. The window for this diffusion into the polycrystalline region is located at the center thereof in the form of a fretwork. Since boron diffuses through the window into the polycrystalline region, it is effectively high in diffusion velocity and reaches the single crystal semiconductor substrate 61 in a short time. In this case the width L of the polycrystalline semiconductor region 63 is selected to be extremely greater than the width *l* of the diffusion of boron, by which the island regions I are isolated from each other by the junction J and that $J_P$ formed in the polycrystalline semiconductor region 63. The junction $J_p$ formed in the polycrystalline semiconductor region is contiguous to a polycrystalline semiconductor region 63I of a lower impurity concentration than the critical concentration on the side of the island regions I, so that the breakdown voltage of the junction $J_p$ is appreciably high. Even in the junction $J_P$ is broken, a leakage current is limited by the polycrystalline semiconductor region 63I of high resistance, by which the leakage current can be held substantially equal to or less than that with a conventional isolation by a junction.

Further, the oxide film 65 is removed at selected locations to form windows, through which an impurity is diffused into the single crystal regions 64 to form therein electrode portions *Ce* contiguous to emitter and collector regions *e* and *c*. Thereafter, electrodes are formed through windows of the oxide film 65 to form interconnections, providing semiconductor integrated circuits but this process is not related directly to the present invention and hence will not be described.

In the above example the island regions I consisting of the single crystal semiconductor regions 64 are surrounded by the polycrystalline semiconductor regions 63 of high resistivity. With a conventional PN junction isolation method, the single crystal semiconductor regions 64 are circumscribed by an isolation region formed by the diffusion of an impurity but the impurity diffuses not only in the direction of the thickness of the semiconductor substrate but also in its widewise direction, so that an excessive region of 10 to 15 microns is formed around the single crystal regions 64. In the present invention, however, the polycrystalline region 63 of high resistance selectively formed by the vapor growth method is used for the isolation of the island regions I and consequently the width L of the region 63 can be held less than 5 microns. Accordingly, the area necessary for each element is decreased down to about 70 percent to provide for enhanced density of the elements. Further, since this invention does not necessitate the diffused isolation region, the parasitic capacity decreases to enhance the high-frequency response characteristic of the semiconductor integrated circuit.

It will be apparent that many modifications and variations may be effected without departing from the scope of the novel concepts of this invention.

I claim as my invention:

1. An integrated circuit wafer having islands of monocrystalline semiconductor material separated from each other by polycrystalline regions comprising:
   - a monocrystalline semiconductor substrate of one conductivity type;
   - regions of seeding sites for polycrystalline development located at selected areas on one face of said substrate;
   - at least one region of opposite conductivity type in said substrate face at one of the areas not covered by said seeding site;
   - a continuous layer of semiconductor material deposited on said substrate face forming said regions of polycrystalline material on said seeding sites and forming said monocrystalline islands on areas of said substrate face not covered by said seeding sites, said semiconductor layer having a conductivity determining type impurity concentration of $10^{12}$ to $10^{17}$ atoms per cubic centimeter;
   - whereby the polycrystalline regions have a higher resistivity than said monocrystalline islands.

2. An integrated circuit wafer according to claim 1, wherein at least some of said monocrystalline islands having junction devices formed therein.

3. An integrated circuit wafer according to claim 1, wherein portions of said substrate immediately below at least some of said monocrystalline islands having a high-impurity-type concentration opposite to that of said substrate and providing PN junction isolation between said some of said islands and said substrate and the high-resistivity polycrystalline regions providing lateral isolation between said islands.

4. An integrated circuit wafer according to claim 1, wherein the said impurity concentration of said islands and said polycrystalline regions are substantially the same.

5. An integrated circuit wafer according to claim 1, wherein said monocrystalline islands have semiconductor circuit elements formed therein.

6. An integrated circuit wafer according to claim 1, wherein said seeding site material is an oxide of silicon.

7. An integrated circuit wafer according to claim 1, wherein said seeding site material is trisilicon tetranitride.

* * * * *